United States Patent [19]

Potetz et al.

[11] Patent Number: 5,268,847
[45] Date of Patent: Dec. 7, 1993

[54] DIGITAL SYNTHESIS OF WAVEFORMS

[75] Inventors: Richard J. Potetz; Barry J. Male, both of West Granby, Conn.

[73] Assignee: United Technologies Corporation, Hartford, Conn.

[21] Appl. No.: 628,268

[22] Filed: Dec. 17, 1990

[51] Int. Cl.[5] ........................ G06F 1/02; G06G 7/16
[52] U.S. Cl. .................................. 364/607; 364/718; 364/851
[58] Field of Search ............... 364/605, 607, 608, 851, 364/718–721

[56] References Cited

U.S. PATENT DOCUMENTS

| | | | |
|---|---|---|---|
| 4,061,909 | 12/1977 | Bryant | 364/851 |
| 4,217,802 | 8/1980 | Deforeit | 364/718 |
| 4,250,558 | 2/1981 | Keyes, IV et al. | 364/718 |
| 4,454,486 | 6/1984 | Hassun et al. | 332/16 R |
| 4,484,296 | 11/1984 | Treise et al. | 364/607 |
| 4,521,865 | 6/1985 | Winkler et al. | 364/608 |
| 4,620,291 | 10/1986 | Vorst | 364/607 |
| 4,631,694 | 12/1986 | Single | 364/607 |
| 4,727,570 | 2/1988 | Tarbouriech | 379/361 |
| 4,752,902 | 6/1988 | Goldberg | 364/721 |
| 4,794,552 | 12/1988 | Burn | 364/851 |
| 4,868,774 | 9/1989 | Beukara | 364/724.01 |

Primary Examiner—Jerry Smith
Assistant Examiner—Jim Trammell

[57] ABSTRACT

An apparatus and method for synthesizing waveforms includes digital circuitry (12) designed to provide a predetermined pulse train of data over a serial line (16), such that, when the pulse train is filtered, a synthesized waveform is produced which approaches an ideal analog waveform.

3 Claims, 5 Drawing Sheets

DIGITAL SYNTHESIS OF WAVEFORMS

DESCRIPTION

1. Technical Field

This invention relates to synthesizing analog waveforms from a digital pattern and more particularly to such systems which minimize the number of interconnections necessary between the digital circuitry supplying the digital pattern and the analog circuitry used to condition the digital pattern.

2. Background Art

Electronic control systems (e.g., electronic engine controls for aircraft gas turbines) receive information about the apparatus or process being controlled from various types of electrical and electro-mechanical sensors. These sensors are typically excited by signals from the electronic controls.

Sensors such as linear variable differential transformers (LVDT), rotary variable differential transformers (RVDT) and resolvers require AC excitations. Therefore such electronic control systems will typically provide sinusoidal excitation signals to these sensors.

One method which is being used to generate sinusoidal excitations is to filter a periodic squarewave whose frequency is equal to the desired frequency of a particular sinusoidal excitation signal, such that the only remaining frequency component is the fundamental. This method results in a sine wave whose frequency is equal to the desired frequency.

However, the drawback with this method is that it requires a multiple pole low pass filter to attenuate the harmonics of the fundamental frequency. As an example, for a fourth order active analog filter a minimum of four operational amplifiers, four capacitors and four resistors are required in order to implement the filter. These parts take up valuable circuit board area since they can not be incorporated within an Application Specific Integrated Circuit (ASIC) which typically contains the digital circuitry for electronic controls.

With the advent of digital communications, digital signal processing, and similar technologies which blossomed following the introduction of the microprocessor, digital synthesis of waveforms became a necessity. Several general methods have arisen.

One popular method is to apply a digital word comprising a plurality of parallel bits to a digital-to-analog (D/A) converter at a rate sufficient to achieve the frequency desired for the waveform. The signal from the D/A convertor is then filtered to smooth the discontinuities associated with the discrete time staircase characteristic of the signal from the D/A convertor.

However, this method has the disadvantage of requiring several integrated circuit pins to output the parallel data to the D/A convertor. In recent years this disadvantage has become more pronounced since the cost of ASIC pins compared to the cost of circuitry internal to the ASIC is increasing.

U.S. Pat. No. 4,061,909 teaches an apparatus for synthesizing waveforms with digital circuitry which uses ten output pins to interface the digital circuitry to the analog circuitry. Employing an apparatus such as this in modern control systems with an ASIC may be unacceptable due to its use of ten of the limited number of available ASIC pins. U.S. Pat. No. 4,752,902 is also faced with the same problem since twelve lines are used to interface the memory device (e.g., a ROM) with the D/A convertor.

DISCLOSURE OF THE INVENTION

One object of the present invention is to synthesize an electrical periodic waveform with few digital drive bits interfaced from the digital circuitry to the analog circuitry.

According to the present invention, a predetermined periodic pulse train of serial data, is conditioned and filtered to provide a synthesized periodic waveform.

By employing a digital-to-analog interface which has one, two, or only a few serial lines, the invention reduces the number of integrated circuit pins which have to be dedicated for interfacing the digital circuitry to the analog circuitry in an apparatus which synthesizes analog waveforms from digital signals. The invention also allows a reduction in the analog signal conditioning circuitry complexity and a reduction in the number of analog parts required to create the synthesized waveform, thereby reducing electronic circuit board area and power consumption while increasing the reliability and manufacturability.

These and other objects, features and advantages of the present invention will become more apparent in light of the following detailed description of an exemplary embodiment thereof as illustrated in the accompanying drawings.

BEST MODE FOR CARRYING OUT THE INVENTION

Figure 1:
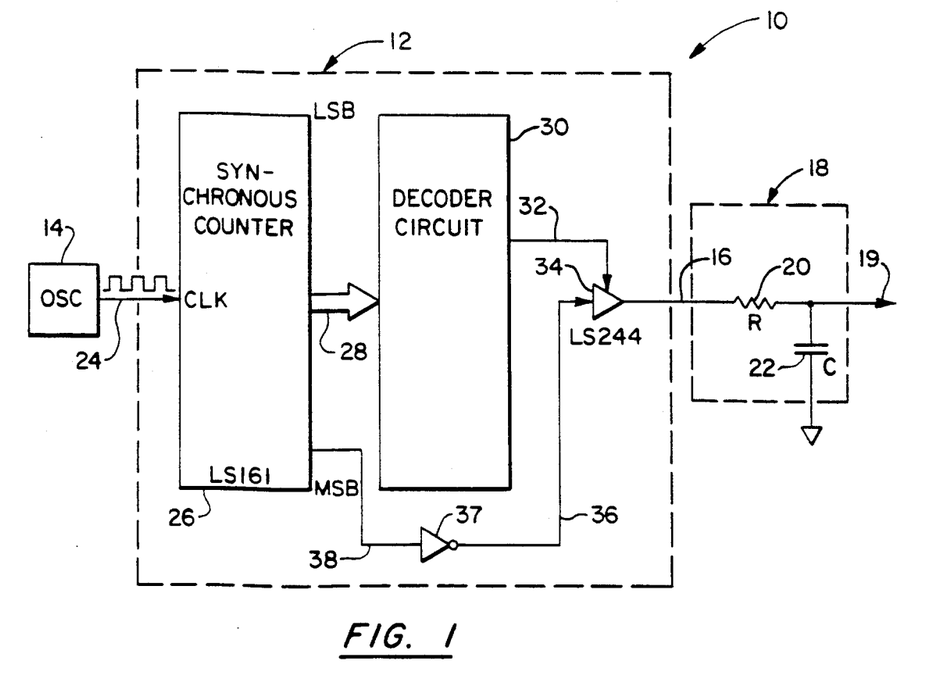
FIG. 1 is a block diagram of a waveform synthesizer which produces a synthesized waveform using a single serial line to interface the digital circuitry to the analog circuitry according to the invention.

Referring to FIG. 1, a waveform synthesizer 10 includes a digital circuit 12 driven by an oscillator 14. The digital circuit 12 provides an output on a single serial line 16 to an analog circuit 18 which outputs a synthesized waveform on a line 19. The analog circuit 18 comprises a resistor 20 of value R, and a capacitor 22 of value C which combine to create a low pass filter, where the product of R and C define the time constant of the filter. The signal on the line 19 is typically output to a power amplification circuit or buffer circuitry each having a high impedance input (e.g., 10 Mega-ohms).

A clock signal on a line 24 clocks a synchronous counter 26 (e.g., a single or cascaded Texas Instrument model 74LS161 chip). The synchronous counter 26 provides a plurality of address lines on an address bus 28 to a decoder circuit 30 (e.g., an electronic memory device such as RAM, PROM, or EEPROM, or a combinational logic network comprising "AND" gates and "OR" gates). The address bus 28 controls whether the decoder circuit 30 outputs a digital high signal (i.e., a "1") or a digital low signal (i.e., "0") on a line 32. Upon the waveform synthesizer 10 being powered up, the synchronous counter 26 is initialized and starts to count from a known state. This known state represents the first sub-period (i.e., sample) in the discrete time representation of the synthesized waveform.

The signal on the line 32 is used to control the state of a three-state buffer 34. If the signal on the line 32 is high (i.e., a "1"), the three-state buffer 34 output on the line 16 is held in the open circuit state, often referred to as the high impedance state or TRI-STATE condition (TRI-STATE is a registered trademark of National Semiconductor Corporation). Conversely, if the signal on the line 32 is low (i.e., a "0") the three-state buffer 34 is taken out of the open circuit state allowing the data on a line 36 from an inverting buffer 37 to propagate through the buffer 34. The inverting buffer 37 receives an input signal on a line 38 from the most significant bit (MSB) of the synchronous counter 26. An example of a three-state buffer is one of the eight three-state devices within the Texas Instruments model 74LS244 chip. It should be understood that the output line from the three-state buffer does not have to be actually opened up to satisfy the conditions for the open circuit state; a high impedance output greater than 5 Mega-ohms is typically sufficient.

The key to the operation of the waveform synthesizer 10 is providing the correct decoder circuit 30 which when stepped through by the synchronous counter 26 produces a predetermined serial data pattern on the line 32. The predetermined serial data pattern controls the three-state buffer 34 whose output is filtered to produce the synthesized waveform. The data pattern is determined through the use of a computer program written to optimize the selection of the pattern for the particular number of sub-periods the waveform has been divided into. The program can be written in most any computer language (e.g., BASIC, FORTRAN, PASCAL, or C), and can be run on any suitable digital computer (not shown).

Figure 2:
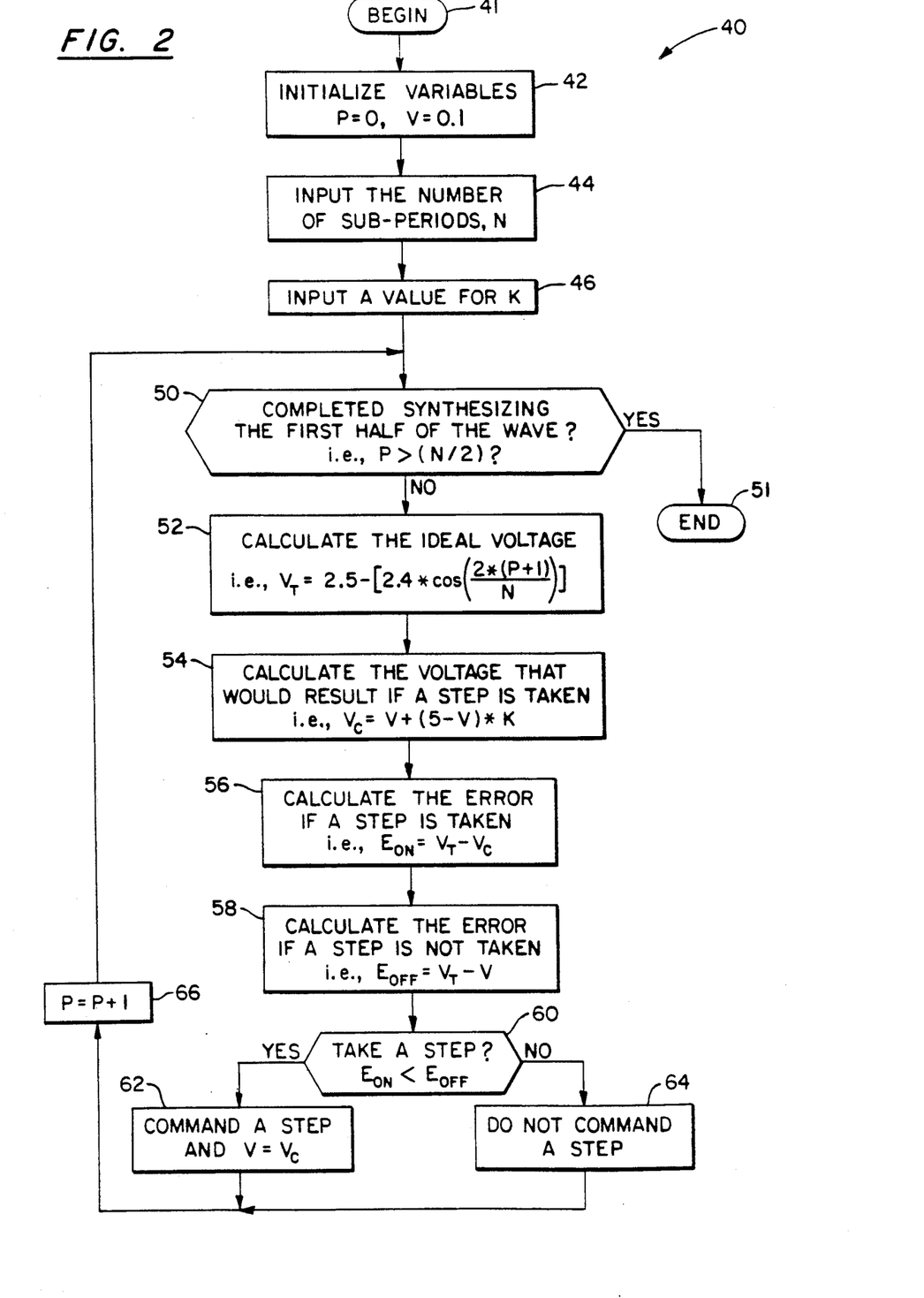
FIG. 2 is a flowchart illustrating the logic used to generate a digital pattern stored in the waveform synthesizer of FIG. 1.

A flowchart 40 of the logic used to generate the data pattern for synthesizing a cosine wave is illustrated in FIG. 2. Upon entering the logic at a step 41, two variables, V and P, used in the program are initialized in a series of steps 42. A step 44 is performed next to input the number of sub-periods, N, into which the waveform shall be divided. A value for k which is used to normalize the time for purposes of determining the predetermined serial data pattern, is then input to the program at a step 46 and k is defined as:

$$k = [1 - e^{(T/((R+R_{on})*C))}] \quad \text{Eq. 1}$$

where:
T = the time period of each sub-period, and
$R_{on}$ = the "on resistance" of the three-state buffer.
As an example, if the frequency of the desired waveform is 2.92969 KHz, and N equals 512 sub-periods, then dividing the desired waveform period which is equal to (1/2929.69) seconds by N produces a value of T equal to 0.66667 microseconds. Assume R is equal to 10 Kohms, C is equal to 3000 picofarads and $R_{on}$ is equal to 120 ohms. Substituting these values into Eq. 1 produces a value for k equal to 0.0217194. It should be understood the values for T, R $R_{on}$ and C are only representative and the exact values should be determined for the particular waveform to be synthesized. Guidelines for selecting these values are discussed hereinafter.

A test 50 is performed next to determine if the program will end. The test 50 is based upon the complete period of the waveform being broken up into N discrete time samples. If the value of P is greater than (N/2), the program ends via an exit point 51 since a pattern has been determined for the first half of the waveform. If the test 50 to end the program fails, a step 52 is performed to calculate the target voltage $V_t$ for the cosine wave at a particular point in normalized time P. The next calculation is performed by a step 54 to determine the voltage $V_c$ which represents the voltage that will be on the line 19 at time (P+1) if a step is commanded at time P.

The logic then calculates during a step 56, $E_{on}$ which represents the error (i.e., the difference) between $V_t$ and $V_c$. Similarly the logic also performs a step 58 to calculate $E_{off}$ which represents the error between $V_t$, and the voltage V currently on the output line 19. A test 60 is then performed to determine if the waveform synthesizer should take a step at time, P.

The test 60 determines if the error can be reduced at time (P+1) by taking a step at time P. If it is, (i.e., $E_{on} < E_{off}$), a voltage step is commanded in step 62 at time P, otherwise a step 64 is performed to command the output of the three-state buffer on the line 16 to the open circuit state. A step 66 is performed next to increment time counter P which represents the number of discrete time samples taken since starting at the known state, (i.e., P=0). The logic then loops back and repeats the aforementioned logic starting with the test 50 to determine if the program should end.

Figure 3:
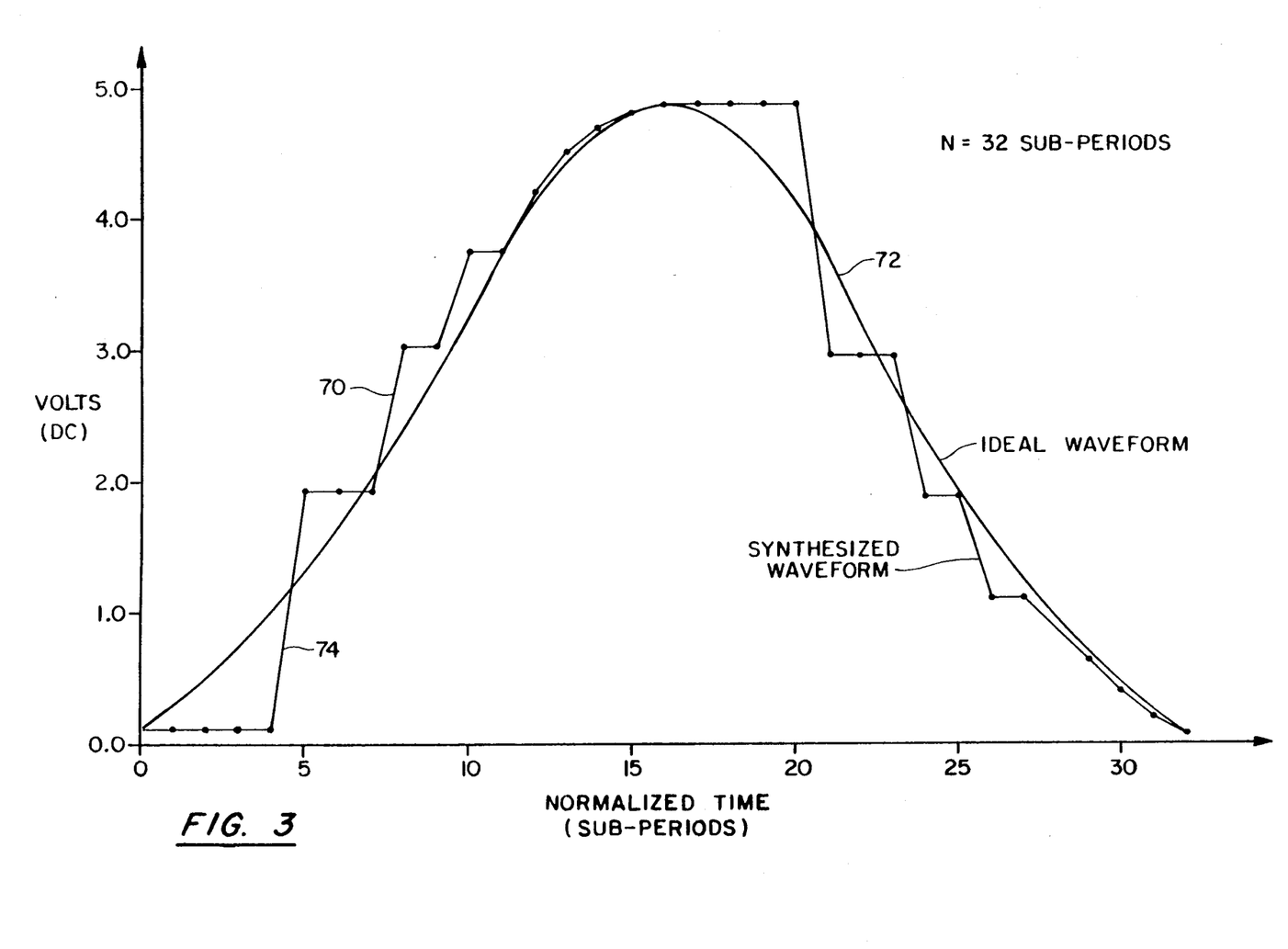
FIG. 3 is an illustration of a synthesized cosine wave created using 32 sub-periods.

Operation of the waveform synthesizer 10 is best understood by an example with a relatively small number of sub-periods such as 32. FIG. 3 illustrates a synthesized cosine wave 70 created with 32 sub-periods (i.e., N=32). In this example, R=10 Kohms, C=2320 picofarads, T=((1/2929.69))/32 and $R_{on}$=120 ohms. Substituting these values into Eq. 1 provides a value for k equal to 0.365. In addition, the value of V is initialized to 0.1 vdc. When these values are used in the logic illustrated in FIG. 2, and the pattern produced is used to design the decoder circuit 30, the synthesized cosine wave 70 of FIG. 3 is created on line 19. An ideal cosine waveform 72 is illustrated in FIG. to allow a comparison against the synthesized cosine waveform 70. Table 1 illustrates the values for the variables used in the logic of FIG. 2 for each of the sub-periods in the first half of the waveform.

TABLE 1

| P | V | $V_t$ | $V_c$ | Eon | Eoff | Step? |
|---|---|---|---|---|---|---|
| 0 | 0.1 | 0.2 | 1.9 | 1.7 | 0.1 | No |
| 1 | 0.1 | 0.3 | 1.9 | 1.6 | 0.2 | No |
| 2 | 0.1 | 0.5 | 1.9 | 1.4 | 0.4 | No |
| 3 | 0.1 | 0.8 | 1.9 | 1.1 | 0.7 | No |
| 4 | 0.1 | 1.2 | 1.9 | 0.7 | 1.1 | Yes |
| 5 | 1.9 | 1.6 | 3.0 | 1.4 | 0.3 | No |
| 6 | 1.9 | 2.0 | 3.0 | 1.0 | 0.1 | No |
| 7 | 1.9 | 2.5 | 3.0 | 0.5 | 0.6 | Yes |
| 8 | 3.0 | 3.0 | 3.8 | 0.8 | 0.0 | No |
| 9 | 3.0 | 3.4 | 3.8 | 0.4 | 0.4 | Yes |

TABLE 1-continued

| P | V | $V_t$ | $V_c$ | Eon | Eoff | Step? |
|---|---|---|---|---|---|---|
| 10 | 3.8 | 3.8 | 4.2 | 0.4 | 0.0 | No |
| 11 | 3.8 | 4.2 | 4.2 | 0.0 | 0.4 | Yes |
| 12 | 4.2 | 4.5 | 4.5 | 0.0 | 0.3 | Yes |
| 13 | 4.5 | 4.7 | 4.7 | 0.0 | 0.2 | Yes |
| 14 | 4.7 | 4.8 | 4.8 | 0.0 | 0.1 | Yes |
| 15 | 4.8 | 4.9 | 4.9 | 0.0 | 0.1 | Yes |

Referring to Table 1 and FIG. 3, during the first four sub-periods 0-3 (i.e., P=0-3) the output on the line 16 is not driven (i.e., the response in the column "Step? " of Table 1 is a "No", so the output of the three-state buffer is commanded to the open circuit state). In sub-period 4, (i.e., P=4) a step is commanded by taking the three-state buffer 34 out of the open circuit state and placing approximately 5 vdc on the line 16 input to the analog circuit 18. The capacitor 22 then begins to charge at an exponential rate which is a function of the RC time constant.

Attention is drawn to the fact the capacitor size C should be selected large enough so the sum of the parasitic capacitances associated with the circuit board traces (not shown) and chip pins (not shown) is negligible in comparison to the value of C. Otherwise the parasitic capacitances may contribute an unacceptably large error to the synthesized waveform.

Following the selection of the value for C, the value of R is chosen so the maximum voltage the synthesized waveform reaches over the period will be slightly below the positive voltage rail, 5 vdc. This ensures that the capacitor 22 does not become saturated and thus no flat spots occur within the synthesized waveform that will increase the total harmonic distortion (THD). As an example, if the positive voltage rail is 5 vdc the value of R may be selected to yield a maximum voltage of 4.9 vdc over a complete period of the waveform. Similarly if the minimum negative voltage rail is 0 vdc, the minimum voltage the synthesized waveform is allowed to reach is approximately 0.1 vdc.

Upon inspection of FIG. 3 it will be seen the voltage increases linearly between sub-periods 4 and 5; however, it should be evident to one skilled in the art that the voltage actually rises exponentially due to the capacitor. Straight line segments, e.g., 74, have been used between sub-periods in the interest of clarity, but, the increase (or decrease) in voltage while a step is being commanded actually has an exponential characteristic since the low pass filter which comprises the analog circuit 18 is a first order device.

Referring back to Table 1 and FIG. 3, the voltage across the capacitor exponentially increases during sub-period 4 until the three-state buffer is commanded to the open circuit state in sub-period 5. At this time the voltage on the line 19, V, is equal to 1.9 vdc, whereas the ideal voltage $V_t$ is equal to 1.6 vdc. In the open circuit state the voltage on the line 19 remains constant thereby retaining the voltage (i.e., 1.9 vdc) that was present just before the buffer 34 was commanded to the open circuit state. The buffer is also open circuited during sub-period 6 since $E_{on}$ is greater than or equal to $E_{off}$. In sub-period 7 a step is commanded and the voltage on the line 19 rises exponentially again until sub-period 8 where the buffer returns to the open circuit state. Voltage on the line 19 is now 3.0 vdc, as compared to the ideal voltage, $V_t$ of 3.0 vdc. Sub-period 9 another step is commanded increasing the voltage from 3.0 vdc at the start of the time period to 3.8 vdc at the end of the time period. Sub-period 10 the buffer is commanded to the open circuit state thereby retaining 3.8 vdc on the line 19. During sub-periods 11-15, steps are commanded with an end result that the voltage on the line 19 is approximately 4.9 vdc at the completion of sub-period 15 (i.e., at the completion of the first half of the waveform). At the completion of sub-period 15 (i.e., the start of sub-period 16) the three-state buffer is commanded to the open circuit state.

Sub-periods 0-15 correspond to the first half of the waveform period which has been broken up into 32 sub-periods of equal time. Since the first half and the second half of a cosine wave (or sine wave) are symmetrical, once the digital pattern for the first half has been determined the pattern for the second half of the wave has also been determined.

To create the pattern for the second half of the waveform, the pattern output on the line 32 during the first half of the waveform is repeated. Therefore the three-state buffer is commanded to the open circuit state in sub-periods 16-19 since it was commanded to the open circuit state during sub-periods 0-3. Similarly, a step is commanded in sub-period 20, since a step was commanded in sub-period 4. In sub-periods 21,22 the buffer is commanded to the open circuit state since the buffer was in the open circuit state during sub-periods 5,6. This same type of one-to-one relationship for sub-periods 23-31 exists with sub-periods 7-15 respectively. Since the voltage during the second half of the waveform is decreasing rather than increasing, the voltage placed on the line 16 while the buffer is not open circuited must be changed to create the second half of the waveform.

During the first half of the waveform, the synthesizer either commands 5 vdc on the line 16 or places the line 16 in the open circuit state. Whereas during the second half of the waveform the synthesizer commands either 0 vdc on the line 16 or places the line 16 in the open circuit state. To control whether 5 vdc or 0 vdc is placed on the line 16 while the buffer 34 is not open circuit, the most significant bit (MSB) on the line 38 from the counter is inverted by the inverting buffer 37 and the output of the inverting buffer is input along the line 36 to the three-state buffer data input.

The first half of the waveform the MSB is low (i.e., a "0") driving the output of the inverting buffer on the line 36 high, resulting in the signal on the line 16 being approximately 5 vdc while the three-state buffer is not open circuited. Conversely, during the second half of the waveform the MSB is high (i.e., a "1"), and thus the output of the three-state buffer is approximately 0 vdc while not in the open circuit state. The MSB on the line 38 controls whether the waveform is increasing or decreasing in voltage.

The number of bits required for the synchronous counter output is determined by the number of sub-periods, N, the waveform is divided into. If N equals thirty two, then five bits are required since five binary bits provide thirty two possible address combinations. Four of the five bits will be used for the address bus 28 and the fifth bit will be the MSB output on the line 38. Similarly if N equals 512, nine bits will be required; eight output on the address bus 28 and one for the MSB.

While the invention has been discussed using 32 sub-periods, it should be understood that the invention is not necessarily so limited and that the more discrete samples of the periodic waveform, the closer the discrete time representation of the periodic waveform will approach the desired analog waveform (e.g., the ideal cosine waveform 72 illustrated in FIG. 3). The synthesized approximation dividing the waveform period into 32 sub-periods may be sufficient for some applications, but in a closed loop control system where the synthesized waveform is used to excite a sensor providing feedback information to the control loop, a better approximation is required. Therefore the waveform is typically divided into 128, 256 or 512 sub-periods to produce a synthesized waveform which approaches more closely the ideal analog waveform.

Figure 4:
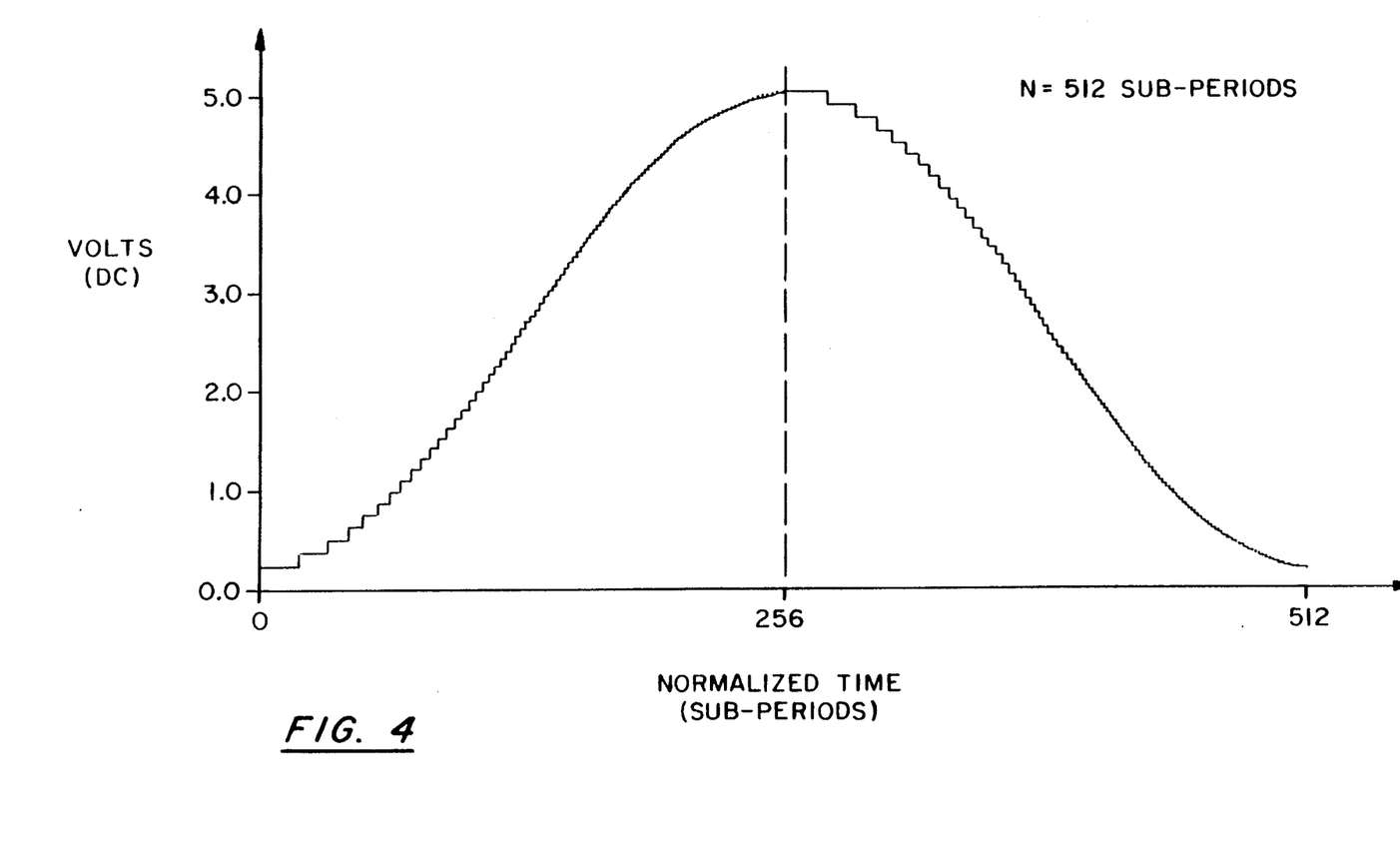
FIG. 4 is an illustration of a synthesized cosine wave created using 512 sub-periods.

FIG. 4 illustrates a synthesized cosine wave produced using 512 sub-periods. It is evident upon inspection that the waveform produced using 512 sub-periods more closely approaches the ideal cosine waveform 72 than the waveform produced with 32 sub-periods. However practical limitations exist on the number of sub-periods the waveform can be divided into. For a particular frequency, $f_{syn}$, which represents the frequency of the signal to be synthesized, the circuitry of FIG. 1 must be clocked at a frequency greater than or equal to $N*f_{syn}$. As an example if the waveform to be synthesized has a frequency equal to 10 KHz (i.e., $f_{syn} = 10$ KHz) and the waveform is divided into $N = 512$ sub-periods, then the clock signal on the line 24 must operate greater than or equal to $f_{syn}*N$, which in this case equals 5.12 MHz. However, as the speed of an electronic network increases so does the cost since the designer must account for such aforementioned problems as parasitic capacitances of chip pins and board traces, as well as electromagnetic interference (EMI) concerns.

Another factor which limits the frequency the synthesized waveform can take on is the higher the frequency to synthesize, the smaller the capacitance C must be made. But as hereinbefore set forth, C can not be made too small otherwise the parasitic capacitance affects increase, resulting in increased total harmonic distortion. As a consequence there becomes a point that the frequency of the waveform to be synthesized can no longer be increased without incurring an unreasonable error contribution from the parasitic capacitances.

The present invention can be practiced numerous different ways due to the many electronic design alternatives available for generating the predetermined digital pattern. Once the pattern is determined through the logic performed in FIG. 2, the decoder circuit 30 (FIG. 1) may be implemented one of several different ways. As an example an electronic memory device can be used or a programmable logic array (PLA). The design may also be performed with a combinational network of "AND" and "OR" gates to create the proper output in response to the plurality of address lines, 28.

Pursuant to the present invention, the minimum and maximum voltages the waveform synthesizer may produce can be adjusted by modifying the analog circuitry 18. As illustrated in FIG. 1 the maximum voltage corresponds to the "on" output voltage of the three-state buffer 34, approximately 5 vdc, and the minimum voltage corresponds to the "off" output voltage of the three-state buffer, approximately 0 vdc. However, it should be understood if additional circuitry is added to the analog circuit the voltage characteristics of the synthesized waveform can be tailored to the particular application.

Figure 5:
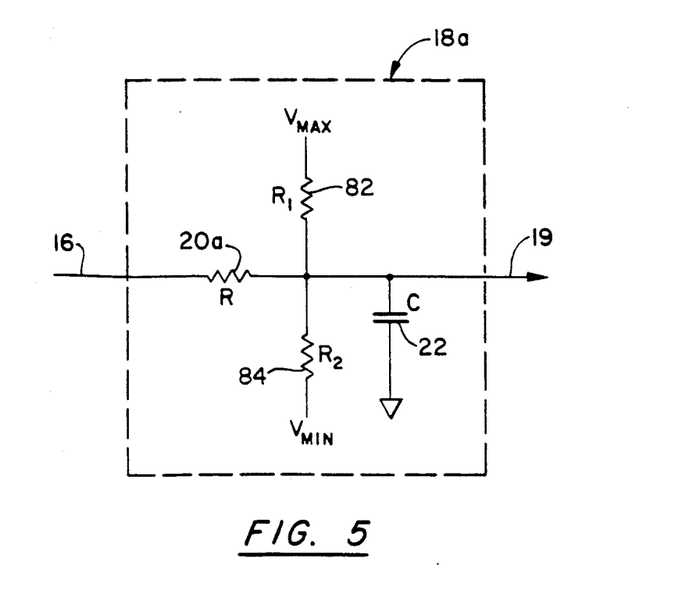
FIG. 5 is an illustration of an alternative analog circuit for use in the embodiment of FIG. 1.

In FIG. 5 is illustrated an alternative analog circuit 18a which provides three exponential rates of voltage change to select from. The three rates of change are: a fast rate to the waveform maximum voltage, a slow rate to the DC component (i.e., the mid-point) of the waveform and a fast rate to the waveform minimum voltage. The signal on the line 16 determines which of these rates is selected for a particular sub-period. The advantage with this embodiment is that it offers either a fast or slow rate of voltage change for each sub-period, in contrast to the embodiment of FIG. 1 where only a single non-zero rate of voltage change and a zero rate of voltage change are provided for each sub-period. The values of resistors 20a,82,84 and the capacitor 22 set the fast and slow rates of voltage change and therefore are selected based upon the characteristics of the waveform to be synthesized.

Although the present invention has been illustrated with a cosine wave, it should be understood that the invention is not limited to only cosine waves; rather the present invention can synthesize any waveform within the bandwidth of the system as set by the value of C and the product of $N*f_{syn}$. As an example, if the waveform to be synthesized is triangular, then the equation which defines the straight line segments of voltage versus time for the triangle wave will be used in FIG. 2 in place of the cosine wave equation equated to $V_t$.

Figure 6:
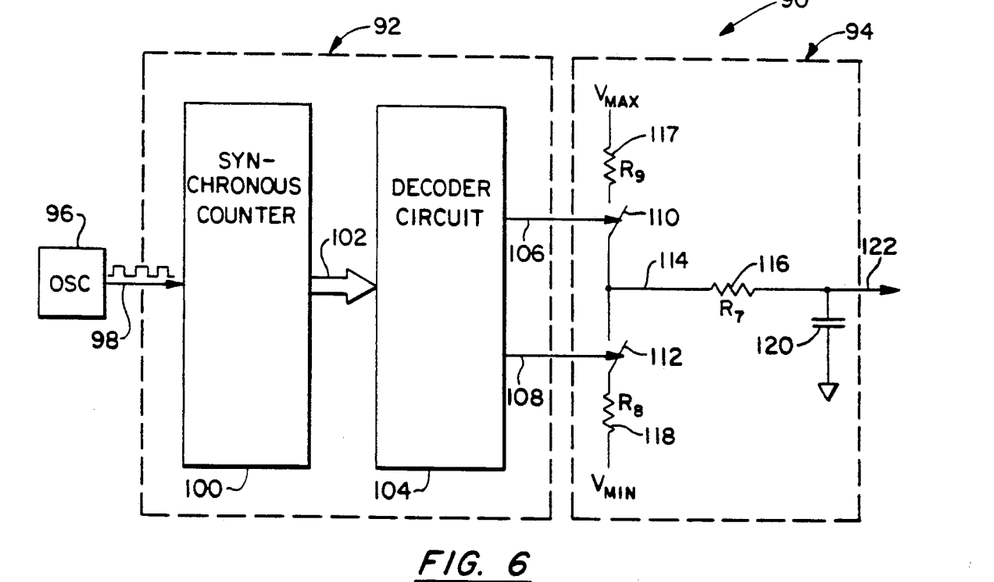
FIG. 6 is a block diagram of an alternative embodiment of a waveform synthesizer which produces a synthesized waveform using two serial lines to interface the digital circuitry to the analog circuitry according to the invention.

The invention is also not limited to synthesizing a waveform with a single digital bit interfacing the digital and analog circuitry. Referring to FIG. 6, an alternative embodiment waveform synthesizer 90 comprises a digital circuit 92 and an analog circuit 94. An oscillator 96 provides a clock signal on a line 98 to a synchronous counter 100 which outputs a plurality of lines 102 to a decoder circuit 104. Similar to the embodiment in FIG. 1, the decoder circuit 104 is designed so that it provides a predetermined pattern in response to the plurality of lines 102. However, in the embodiment of FIG. 6 the decoder circuit 104 simultaneously provides two predetermined patterns: a first predetermined pattern on a first line 106 and a second predetermined pattern on a second line 108. The pattern on the first line 106 controls a first switch 110 and the pattern on the second line 108 controls a second switch 112. Since there are two switches 110,112, of the single throw double pole (STDP) type, three possible voltages can be selected for placement on a line 114 or the line 114 may be open circuited during any sub-period. The time constant of the first order low pass filter within the analog circuit 94 is a function of three resistors 116-118 and a capacitor 120. The synthesized waveform is provided on an output line 122.

To ascertain what the first and second predetermined patterns should be for the alternative embodiment of FIG. 6, the logic of FIG. 2 is modified to compare three possible conditions for each sub-period: a fast increasing/decreasing voltage rate, a slow increasing/decreasing voltage rate, or an open circuit in which both the first and second switches are in the open state. This is in contrast to the embodiment of FIG. 1 where only two choices were available each sub-period: to keep the voltage constant, or take a step.

One feature of this alternative embodiment is that it does not require as many sub-periods as the embodiment of FIG. 1 to achieve a particular accuracy since the slope of the ideal analog waveform during any sub-period can be more accurately approximated since two voltage rates of change are available to choose from rather than one. However, the benefit of using a reduced number of sub-periods has to be weighed against the disadvantage of requiring another integrated circuit pin to interface the digital circuit 92 to the analog circuit 94.

Figure 7:
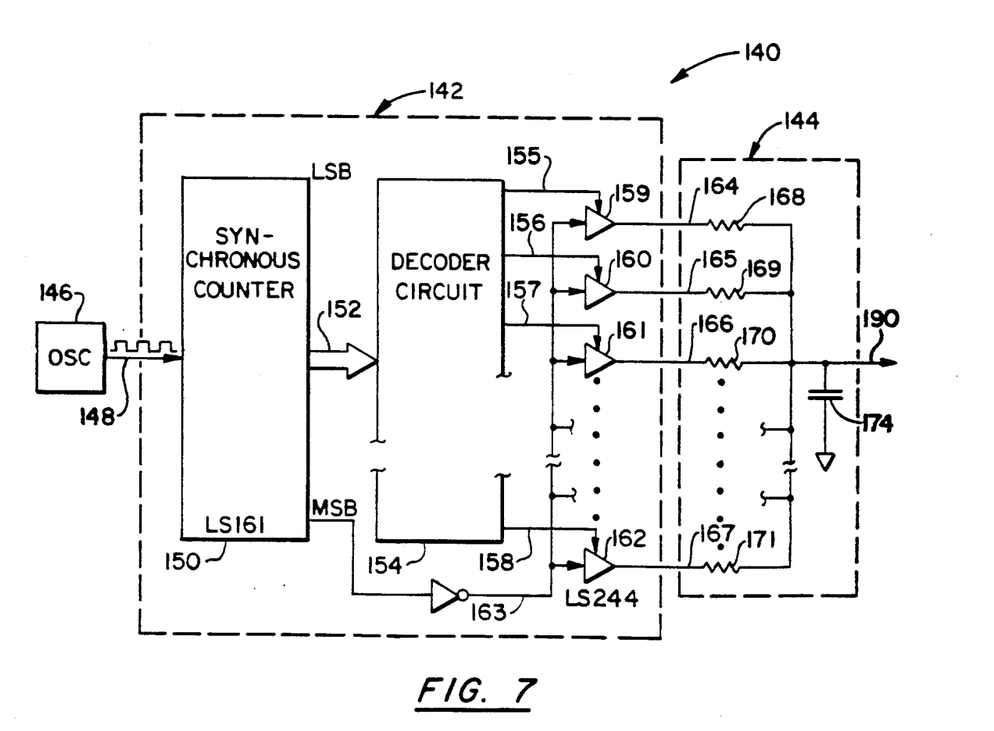
FIG. 7 is a block diagram of another alternative embodiment of a waveform synthesizer which produces a synthesized waveform using a plurality of serial lines to interface the digital circuitry to the analog circuitry according to the invention.

In FIG. 7 is illustrated another alternative embodiment 140 of the present invention employing a plurality of lines to interface a digital circuit 142 to an analog circuit 144 in accordance with the present invention. An oscillator 146 provides a clock signal on a line 148 to a synchronous counter 150 which outputs a plurality of lines 152 to a decoder circuit 154. Similar to the embodiments in FIG. 1 and FIG. 6, the decoder circuit 154 is designed so that it provides a predetermined pattern on each of a plurality of decoder output lines 155-158 in response to the plurality of lines 152. However, in the embodiment of FIG. 7 the decoder circuit 154 simultaneously provides a plurality of predetermined patterns: a first predetermined pattern on a first line 155 and a second predetermined pattern on a second line 156, and etcetera for the rest of the plurality of decoder output lines (157,158). The output lines 155-158 are input to a plurality of three-state buffers 159-162 which each receive a signal on a line 163. During any particular sub-period, none, one or any combination of the three-state buffers 159-162 may be out of the open circuit state.

Each of the three-state buffers 159-162 illustrated in FIG. 7 provides an output on one of a plurality of lines 164-167 to one of a plurality of weighted resistors 168-171. The weighted resistor values are selected based upon the granularity of the waveform to be synthesized and are typically normalized to a resistor value, R. In this embodiment the resistance values for the weighted resistors 168-171 are R, ½R, ¼R, and (⅛)R respectively.

The time constant of the first order low pass filter within the analog circuit 144 is a function of which of the weighted resistors 168-171 has current flowing through it. As stated hereinbefore with respect to FIG. 7, none, one or any combination of the three-state buffers 159-162 may be out of the open circuit state at any given time. The weighted resistor values of the particular three-state buffers out of the open circuit state determines the low pass filter time constant along with the capacitance value of a capacitor, C, 174.

To generate the predetermined patterns to be output on the decoder output lines 155-158, the flow chart illustrated in FIG. 2 is modified to determine which buffers should be taken out of open circuit state to reduce the synthesizing error between the synthesized waveform and the ideal waveform. This comparison tests all the possibilities, as an example with four buffers 159-162 as shown in FIG. 7 there are sixteen possible buffer combinations which have to be compared to determine which combination provides the minimum error for that particular sub-period. Selecting which buffers to take out of the open circuit state (if any for a particular sub-period), determines the time constant of the low pass filter for that particular sub-period and therefore the exponential characteristic of the synthesized signal on a line 190 for that particular sub-period.

As so far described FIG. 7 is similar to FIG. 1 except the embodiment of FIG. 1 uses a single line to implement the object of the present invention and the embodiment of FIG. 7 uses a plurality of lines. Nevertheless the commonality lies in the fact that the waveform to be synthesized is a composite of exponential waveforms. Referring to FIG. 7, if during a first sub-period buffer 159 was taken out of the open circuit state, and during a second sub-period immediately following the first, buffer 159 was placed back into the open circuit state and buffer 160 taken out of the open circuit state, then it is obvious the exponential rise of the synthesized signal during the second sub-period is faster since the weighted resistor value of resistor 169 is less than the value for resistor 168. Therefore, during any sub-period the exponential rate of change of the voltage on the line 190 is controlled by which of the buffers 159-162 are taken out of the open circuit state.

Although the embodiments of FIGS. 1 and 7 have been illustrated with three-state buffers, it should be understood that the invention may use discrete transistors arranged to provide the high voltage, low voltage or open circuit condition as an alternative to the three-state buffer. Also the present invention is not limited to solely synthesizing AC excitation signals; as an example it may also be used to generate a built-in-test signal internal to an electronic system for fault detection and isolation.

All the foregoing changes and variations are irrelevant to the invention, it suffices that a waveform synthesizer produces a synthesized waveform by using digital circuitry designed to provide a predetermined pulse train of data over a serial line such that, when the pulse train is filtered, a synthesized waveform is produced which approaches an ideal analog waveform.

Although the present invention has been shown and described with respect to an exemplary embodiment thereof, it should be understood by those skilled in the art that the foregoing and various other changes, omissions and additions to the form and detail thereof, may be made therein without departing from the spirit and scope of the invention.

We claim:

1. A waveform synthesizer for providing a digitally synthesized stair case waveform of a constant frequency, comprising:

an oscillator for providing a system clock signal;
a synchronous counter for counting said clock signals, and providing a counter signal indicative of the number of said clock signals, wherein said counter signal is a digital signal comprising a plurality of parallel binary data bits;
a decoder responsive to said counter signal for providing a decoder output signal;
an inverter responsive to the most significant bit of said counter signal, for providing an inverted binary signal value of the most significant bit of said counter signal;
a three state buffer whose data input is responsive to said inverted binary signal value, and whose control input is responsive to said decoder output signal, said buffer for providing on a single output line a serial periodic pulse train signal of a predetermined sequence with a period equal to the reciprocal of the constant frequency, where said predetermined sequence of said serial periodic pulse train signal is a composite of an integer number of individual sub-periods where the value of said serial periodic pulse train signal each sub-period is equal to one of a plurality of selectable discrete signal values, which include a (a) high voltage value (b) a low voltage value and (c) an open circuit high impedance value, where said serial periodic pulse train signal is created by applying one of said plurality of discrete signal values on said single output line each sub-period in said predetermined sequence; and a low pass filter, for filtering said serial periodic pulse train signal to provide said digitally synthesized stair case waveform.

2. The waveform synthesizer of claim 1, wherein said low pass filter provides said digitally synthesized stair case signal as a composite of exponential waveforms.

3. The waveform synthesizer of claim 2, wherein said digitally synthesized stair case signal is a voltage signal and during any of said sub-periods the voltage value of said stair case signal is either exponentially increasing, exponentially decreasing, or constant during the sub-period.

* * * * *